United States Patent [19]

Muramatsu

[11] Patent Number: 4,502,201
[45] Date of Patent: Mar. 5, 1985

[54] SEMICONDUCTOR INTEGRATED CIRCUIT DEVICE AND FABRICATION METHOD THEREOF

[75] Inventor: Akira Muramatsu, Takasaki, Japan

[73] Assignee: Hitachi, Ltd., Tokyo, Japan

[21] Appl. No.: 326,278

[22] Filed: Dec. 1, 1981

[30] Foreign Application Priority Data

Dec. 1, 1980 [JP] Japan ................... 55-168044

[51] Int. Cl.³ .................................... H01L 21/76
[52] U.S. Cl. .................... 29/571; 148/1.5;
29/576 W; 427/93; 156/653; 156/657
[58] Field of Search ............. 427/93; 29/571, 576 W;
148/1.5; 156/653, 651

[56] References Cited

U.S. PATENT DOCUMENTS 3,962,717 6/1976 O'Brien .................... 357/44
4,157,268 6/1979 Bergeron .................. 148/1.5

FOREIGN PATENT DOCUMENTS 32016 7/1981 European Pat. Off. .
2455347 5/1976 Fed. Rep. of Germany .
2835632 2/1980 Fed. Rep. of Germany .
3029013 2/1982 Fed. Rep. of Germany .
2352403 12/1977 France .
2054263 2/1981 United Kingdom .

*Primary Examiner*—John D. Smith
*Attorney, Agent, or Firm*—Antonelli, Terry & Wands

[57] ABSTRACT

The invention discloses a semiconductor integrated circuit device characterized in that an inverse transistor element portion and a normal transistor element portion are formed in a common semiconductor layer and are separated from each other by an oxide layer penetrating said semiconductor layer in the direction of its thickness. In particular, in order to attain improved characteristics for the respective devices, the semiconductor layer of the inverse transistor element portion is thinner than the semiconductor layer of the normal transistor element portion.

14 Claims, 9 Drawing Figures

SEMICONDUCTOR INTEGRATED CIRCUIT DEVICE AND FABRICATION METHOD THEREOF

BACKGROUND OF THE INVENTION

This invention relates to a semiconductor integrated circuit device (hereinafter simply referred to as an "IC") including an I$^2$L (Integrated Injection Logic) element portion having an inverse transistor and a bipolar circuit element portion having a normal transistor. Further, this invention also relates to a method of fabricating the IC.

The term "inverse transistor" herein denotes a transistor having a structure in which a semiconductor body such as a semiconductor substrate or a semiconductor layer (epitaxial layer) is used as its emitter region, a first semiconductor region formed in the semiconductor body is used as the base region and a second semiconductor region formed in the first semiconductor region is used as the collector region. On the other hand, the term "normal transistor" herein denotes a transistor having a structure in which the above-mentioned second semiconductor region is used as the emitter region, the above-mentioned first semiconductor region is used as the base region and the above-mentioned semiconductor body is used as the collector region.

When an I$^2$L element and a linear or digital circuit element are to be separately disposed on a common epitaxial layer, a drawback develops with regard to the respective element characteristics. Specifically, the current amplification factor $\beta_i$ of the inverse transistor of the I$^2$L element increases with a decreasing thickness of the epitaxial layer. However, the collector-to-emitter or collector-to-base withstand voltage in the linear circuit element having a normal vertical transistor structure increases with an increasing thickness of the epitaxial layer. Therefore, in order to have both elements present together on a common epitaxial layer, it becomes necessary to sacrifice either the current amplification factor or the withstand voltage insofar as the thickness of the epitaxial layer is uniform.

SUMMARY OF THE INVENTION

It is therefore an object of the present invention to provide an IC of a composite element type in which both kinds of transistors are disposed on a single semiconductor substrate without lowering either the current amplification factor of the inverse transistor or the withstand voltage of the normal transistor.

It is another object of the present invention to provide a method of fabricating the above-mentioned IC with a high level of reproducibility.

In accordance with the IC of the present invention, the inverse transistor element portion and the normal transistor element portion are disposed on a common semiconductor layer and are separated from each other by an oxide layer penetrating the semiconductor layer in the direction of its thickness. Further, in conjunction with this, the semiconductor layer of the inverse transistor element portion is thinner than the semiconductor layer of the normal transistor element portion.

DESCRIPTION OF THE PREFERRED EMBODIMENTS

Hereinafter, an embodiment in which the present invention is applied to a composite layer type IC including an I$^2$L circuit element portion having an inverse transistor and a linear transistor circuit element portion having a normal transistor will be described with reference to the drawings.

Figure 1A:
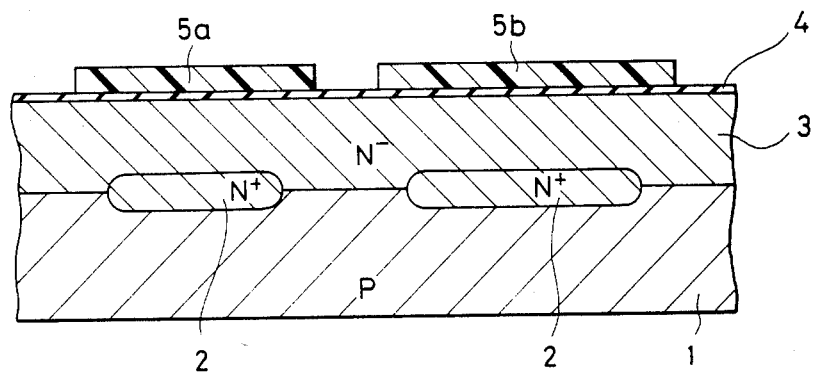
FIGS. 1A through 1G are sectional views showing the principal portions of an I$^2$L—linear element co-presence type IC in accordance with an embodiment of the present invention. These figures progressively show the steps of the production process for the IC.

The IC of this embodiment will be explained according to its production steps. First, as depicted in FIG. 1A, and N$^-$ type epitaxial layer 3 is grown to a thickness of 1.8 to 2.0 μm on a P type Si substrate 1 over an N$^+$ type buried layer 2. The surface of this epitaxial layer 3 is thermally oxidized to grow a thin protective SiO$_2$ film 4. Then, a Si$_3$N$_4$ is grown on the SiO$_2$ film 4 by vapor growth and shaped in predetermined patterns 5a and 5b by ordinary photoprocessing. In this case, the Si$_3$N$_4$ film 5a covers a portion where a bipolar transistor will be formed while the Si$_3$N$_4$ film 5b covers a portion where the I$^2$L element will be formed.

Figure 1B:
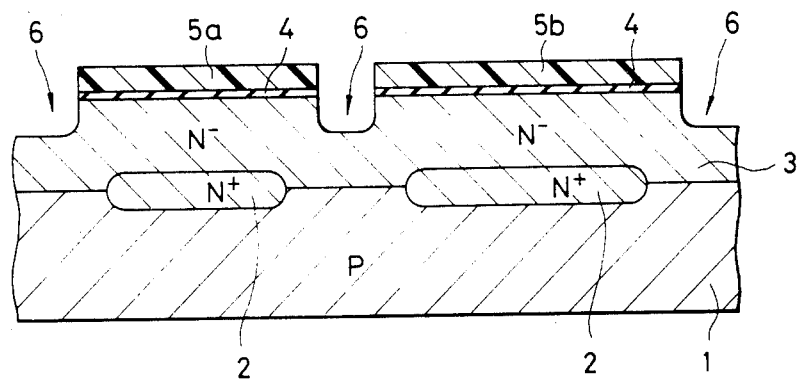

Next, as shown in FIG. 1B, the SiO$_2$ film 4 and the epitaxial layer 3 below these Si$_3$N$_4$ films 5a, 5b are selectively etched to a depth of 0.6 to 1.2 μm using the films 5a, 5b as the mask, forming a recess 6 for LOCOS oxidation (local oxidation).

Figure 1C:
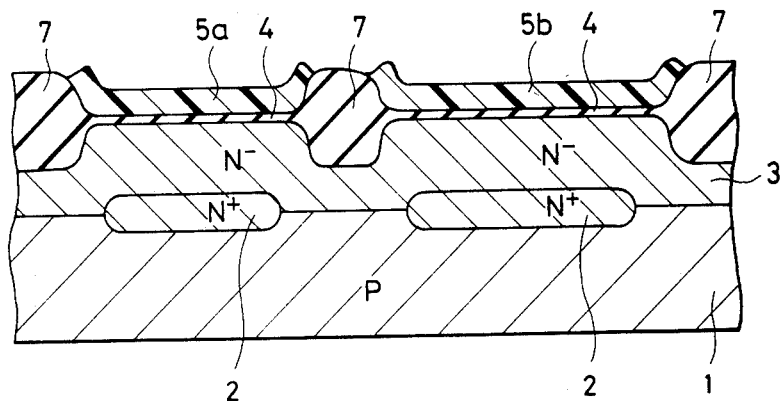

Subsequently, Si in the recess 6 is thermally oxidized using the Si$_3$N$_4$ films 5a, 5b as the mask as shown in FIG. 1C so as to form a relatively thick SiO$_2$ layer 7 which extends into the epitaxial layer 3 in the direction of its thickness. This SiO$_2$ layer 7 encompassing each element region (i.e. the inverse transistor and the normal transistor) and separates them from one another. The growth condition for the oxidizing of the SiO$_2$ layer 7 is, for example a temperature of 1,000° C. for a period of 5 hours in wet O$_2$.

Figure 1D:
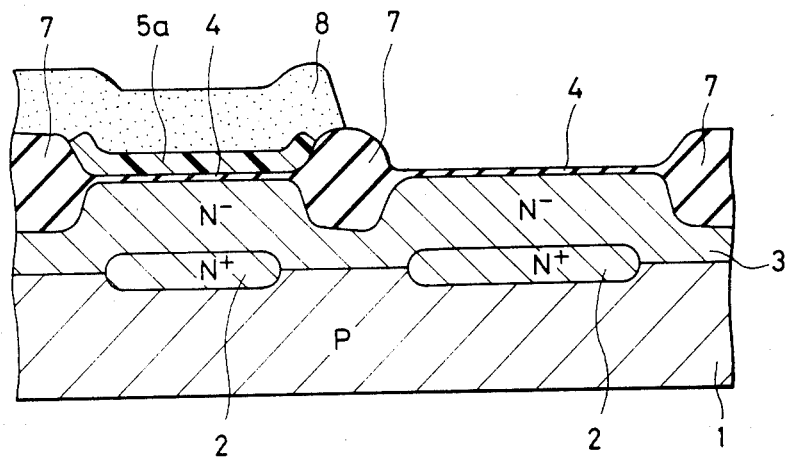

Next, as shown in FIG. 1D, a photoresist 8 is deposited by ordinary techniques so as to cover a region in which the normal transistor of the bipolar transistor circuit element portion is to be formed. The the Si$_3$N$_4$ film 5b on the I$^2$L side that is not covered with the photoresist 8 is selectively removed by exposure to CF$_4$ plasma, exposing the original SiO$_2$ film 4 at that portion.

Figure 1E:
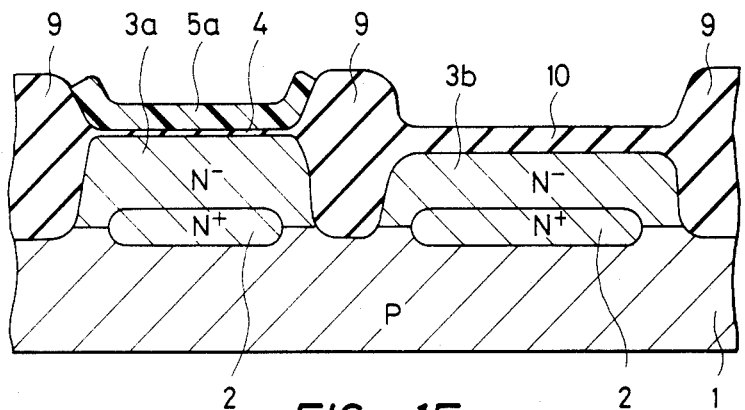

Next, as shown in FIG. 1E, the surface is successively thermally oxidized to extend the SiO$_2$ layer 7 until it penetrates epitaxial layer 3, thereby growing a thick SiO$_2$ layer 9 separating the epitaxial layer 3 into the element regions 3a and 3b. This process is referred to as "LOCOS oxidation", and the SiO$_2$ layer 9 thus obtained functions as an isolating film. Simultaneously with this LOCOS oxidation, the region 3b is oxidized so that the thin SiO$_2$ film 4 grows into a relatively thick thermal oxidation SiO$_2$ film 10 as shown in the drawing. This oxidation condition may be performed at a temperature of 1,000° C. for a period of three hours in wet O$_2$. By this treatment, the thickness of the SiO$_2$ film 10 becomes 0.5 to 0.7 μm. Consequently, the difference between the thickness of the surface SiO$_2$ film 4 of the region 3a of the bipolar transistor circuit element portion and the thickness of the surface SiO$_2$ film 10 of the inverse transistor region 3b of the I$^2$L circuit element portion becomes approximately 0.3 μm, for example, at this time. This difference is considerable since the original epitaxial layer 3 is extremely thin, i.e., 1.8 to 2.0 μm.

Figure 1F:
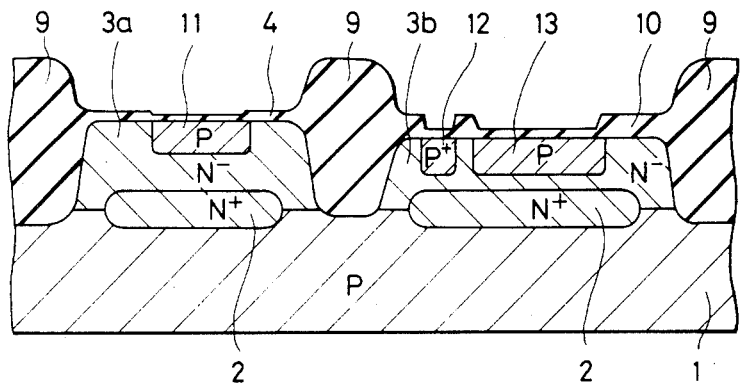

Next, as shown in FIG. 1F, after the $Si_3N_4$ film 5a is removed by plasma etching as described above, windows are bored in the $SiO_2$ surface films 4 and 10 by an ordinary photoprocess, and a P type impurity such as boron vapor is diffused through the thus-formed openings or reduced thickness portions. This forms a P type semiconductor region 11 to serve as the base in the region 3a, and P+ semiconductor regions 12 and 13 to serve as the injector and base, respectively, in the inverse transistor in the region 3b.

Figure 1G:
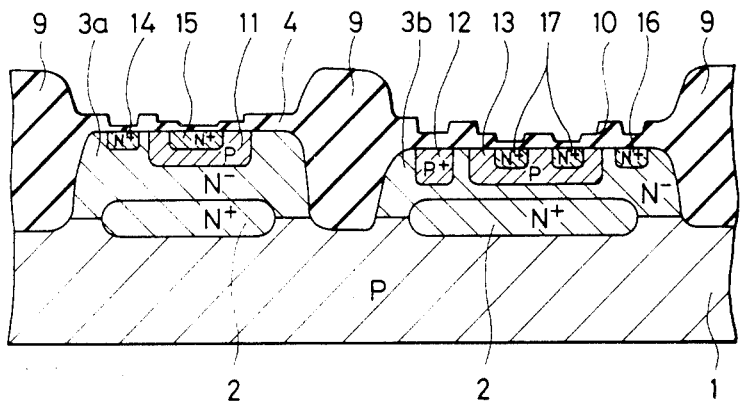

As shown in FIG. 1G, the surface of each $SiO_2$ film 4 and 10 is further selectively etched using an ordinary photoprocess, and an N type impurity such as phosphorous is diffused in the gaseous phase from each opening or reduced thickness portion thus formed. In this manner, in region 3a an N+ ohmic contact region 14 is formed for taking out a collector electrode, and an N+ semiconductor region 15 is formed to serve as the emitter. In region 3b an N+ ohmic contact region 16 is formed to take out the emitter electrode of the inverse transistor, and an N+ semiconductor region 17 is formed as a multicollector. The $SiO_2$ films 4 and 10 on the surface are left, as passivation films, but the surfaces of these films 4 and 10 are preferably treated with phosphorous to stabilize them. Though not shown in the drawing, an opening is formed in the surface of each $SiO_2$ film by an ordinary photoprocess, and electrodes are then fitted into these openings (by patterning after vacuum evaporation of Al on the entire surface, for example). Also an Al wiring as an upper wiring layer would be disposed with a necessary inter-layer insulating film, thereby completing the IC. These elements have been omitted from the drawings for clarity inasmuch as their formation is well known in the art.

In accordance with the thus formed composite type IC in which the $I^2L$ circuit element portion and the linear (bipolar) circuit element portion are both present, the thickness of the epitaxial layer 3b of the $I^2L$ circuit element portion is considerably smaller than that of the epitaxial layer 3a of the linear circuit element portion due to the difference between the thicknesses of $SiO_2$ films 10 and 4. For this reason, the current amplification ratio $\beta_1$ of the inverse transistor in the $I^2L$ circuit element portion can be made large while retaining the withstand voltage of the normal vertical transistor in the linear circuit element portion at a high level. Hence, both requirements for a high amplification factor and for a high withstand voltage can be satisfied in the same chip. Further, an IC with these excellent in these characteristics can be easily fabricated by carrying out LOCOS oxidation over two stages as described above. Moreover, in this case, if the oxidizing conditions (especially the oxidation time) in the step shown in FIG. 1D are suitably set, the difference between the thicknesses of epitaxial layers 3a and 3b can be controlled arbitrarily and with a high level of reproducibility. Accordingly, the structure and method in accordance with this embodiment are extremely effective when the epitaxial layer for forming each element is extremely thin.

In particular, because the impurity concentration distribution in the direction of depth of the $I^2L$ inverse transistor changes sharply between the semiconductor regions, the current amplification factor can also be improved in this respect. This advantage results from the fact that the thickness of the epitaxial layer 3b is reduced in this embodiment by growing the thick $SiO_2$ film on the surface as described above, and, therefore, high concentration post-diffusion of the N type impurity inside the same layer does not occur. If the phosphorous inside the N+ buried layer 2 is post-diffused up into the epitaxial layer 3b in order to reduce the effective thickness of the epitaxial layer 3b, the change in the impurity concentration along the direction of thickness is only gradually graded towards the base side (13) due to the post-diffusion, and hence the current amplification ratio $\beta_i$ lowers.

In accordance with the present invention, since the thickness of the semiconductor layer of the $I^2L$ circuit element portion is made earlier than that of the normal bipolar circuit element portion already described, high current amplification ratio of the former and high withstand voltage of the latter can be simultaneously accomplished on the same chip. Moreover, these requirements can be easily satisfied with a high level of reproducibility or controllability by suitably selecting the oxidizing conditions when performing the surface oxidation. This is especially effective when the epitaxial layer is thin.

Also, in accordance with the present invention, excellent isolation between the circuit elements is ensured by the insulating film so that the tendency to form a parasitic transistor is greatly reduced. The integration density can also be improved in comparison with PN junction isolation.

Though the present invention is explained with reference to the above-mentioned embodiment, various modifications can be made on the basis of the technical concept of the present invention. For example, in the step shown in FIG. 1D, the $Si_3N_4$ film 5b may be removed by etching with hot phosphoric acid in liquid phase. In such a case, it is preferred that an $SiO_2$ film be disposed by a chemical vapor growth process between the photoresist 8 and the $Si_3N_4$ film 5a. In the same figure, the $Si_3N_4$ film 5a may also be removed and an oxidation-resistant mask may be applied to that portion. And, of course, the semiconductor type of each of the above-mentioned semiconductor regions may be suitably changed if desired.

Figure 2A:
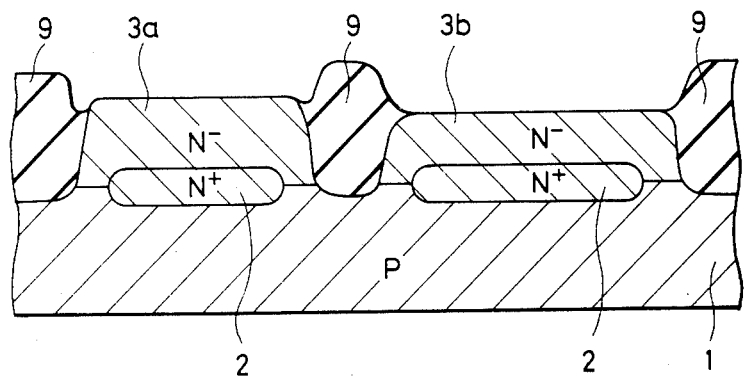
FIGS. 2A through 2B are sectional views showing another embodiment of the present invention.
Figure 2B:
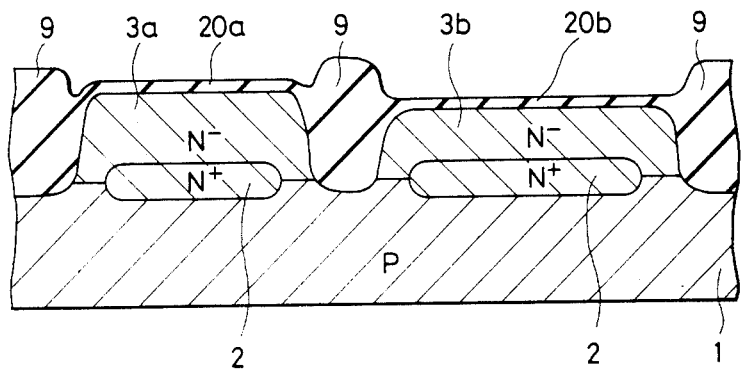

As another embodiment of the present invention, the following method is proposed. Namely, after the step shown in FIG. 1E is completed, the $SiO_2$ films 4 and 10 formed on the surface of the regions 3a and 3b are removed by etching, as shown in FIG. 2A. Then, as shown in FIG. 2B, and insulating films 20a and 20b of a desired thickness are formed on the exposed surface of the regions 3a and 3b. Thereafter, the steps shown in FIGS. 1F through 1A are carried out for formation of the regions of the respective transistors.

Most preferably, the insulating films 20a and 20b are $SiO_2$ films formed by oxidizing the surface of the regions 3a and 3b. However, if desired, they may be oxide films formed a CVD (chemical vapor deposition) process. In any event, in accordance with this method, the insulating films 20a and 20b are formed on the surface of the regions 3a and 3b are equal to each other so that simultaneous etching of these insulating films 20a and 20b can readily be accomplished.

In the step shown in FIG. 1D in each of the above-mentioned embodiments, the photoresist 8 may be left as such and an N type impurity such as phosphorus may be introduced into the epitaxial layer 3b through the thin $SiO_2$ film 4 so as to reach the N+ type buried layer 2. Introduction of the N type impurity into the epitaxial layer 3b makes it possible to increase the speed of the $I^2L$ circuit element. In this regard, it should be noted that since no mask is necessary for introducing the N type impurity, increasing the speed of the I²L circuit element can easily be accomplished.

What is claimed is:

1. A method of fabricating a semiconductor integrated circuit device comprising:
   (a) oxidizing predetermined regions of a semiconductor layer to form an oxide layer to an intermediate depth of said semiconductor layer in the direction of its thickness, thereby to divide said semiconductor layer into a first region in which a normal transistor is to be formed and a second region in which an inverse transistor is to be formed;
   (b) covering the first region in which a normal transistor element portion is to be formed with an oxidation-resistant mask while leaving the second region in which said inverse transistor is to be formed uncovered; and
   (c) further oxidizing the predetermined regions of said semiconductor layer to make said oxide layer penetrate through said semiconductor layer in the direction of its thickness, thereby isolating the first and second regions from each other, and, at the same time, oxidizing the uncovered surface of said second region to form a surface oxide film of said second region in which said inverse transistor is to be formed, said surface oxide film of said second region being thicker than a surface oxide film of said first region in which said normal transistor element portion is to be formed so that said second region is made thinner than said first region.

2. A method of fabricating a semiconductor integrated circuit device according to claim 1, further comprising removing the surface oxide films of uneven thickness after step (c) and forming surface oxide films of equal thickness on both the first and second regions of the semiconductor layer.

3. A method of fabricating a semiconductor integrated circuit device according to claim 1, wherein said further oxidizing the predetermined regions of said semiconductor layer and said oxidizing the uncovered surface of said second region are performed by thermal oxidation.

4. A method of fabricating a semiconductor integrated circuit device according to claim 3, wherein said oxidizing predetermined regions of a semiconductor layer is performed by thermal oxidation.

5. A method of fabricating a semiconductor integrated circuit device according to claim 4, wherein said semiconductor layer is an epitaxial semiconductor layer of a first conductivity type, formed on a semiconductor substrate of a second conductivity type opposite to said first conductivity type.

6. A method of fabricating a semiconductor integrated circuit device according to claim 5, wherein the epitaxial semiconductor layer and the semiconductor substrate are both made of Si.

7. A method of fabricating a semiconductor integrated circuit device according to claim 5, including the further steps, after step (c), of forming a normal transistor in said first region and an inverse transistor in said second region.

8. A method of fabricating a semiconductor integrated circuit device comprising:
   (a) forming a semiconductor layer of a first conductivity type on the surface of a semiconductor substrate of a second conductivity type opposite to said first conductivity type;
   (b) selectively oxidizing a predetermined portion of said semiconductor layer to an intermediate depth of said semiconductor layer in the direction of its thickness, thereby to form an oxide layer having a thickness and to make first and second surface portions separated from each other by said oxide layer;
   (c) masking said first surface portion with an oxidation-resistant mask while leaving said second surface portion unmasked; and thereafter
   (d) increasing said thickness of said oxide layer by thermal oxidation growth to make an oxide isolation layer for dividing said semiconductor layer into a first region in which a normal transistor is to be formed and a second region in which an inverse transistor is to be formed and, at the same time, oxidizing said unmasked second surface portion by said thermal oxidation growth to make a surface oxide film of said second surface portion that is thicker than a surface oxide film of said first surface portion so that said second region is made thinner than said first region.

9. A method of fabricating a semiconductor integrated circuit device according to claim 8, further comprising removing the surface oxide films of uneven thickness after step (d) and forming surface oxide films of equal thickness on both said first and second regions.

10. A method of fabricating a semiconductor integrated circuit device according to claim 8, including the further steps, after step (d), of forming a normal transistor in the first region and an inverse transistor in the second region.

11. A method of fabricating a semiconductor integrated circuit device comprising:
   (a) forming a semiconductor layer of a first conductivity type on the surface of a semiconductor substrate of a second conductivity type opposite to said first conductivity type;
   (b) forming a first oxidation-resistant masking layer on a first predetermined surface portion of said semiconductor layer and a second oxidation-resistant masking layer on a second predetermined surface portion of said semiconductor layer, said second predetermined surface portion being separated from said first predetermined surface portion;
   (c) selectively etching the unmasked portion of said semiconductor layer to a depth of said semiconductor layer in the direction of its thickness;
   (d) oxidizing the etched portion of said semiconductor layer to form an oxide layer having a thickness;
   (e) removing said second oxidation-resistant masking layer, while leaving said first oxidation-resistant masking layer on said first predetermined surface portion; and
   (f) increasing said thickness of said oxide layer by thermal oxidation growth to make an oxide isolation layer for dividing said semiconductor layer into a first region in which a normal transistor is to be formed and a second region in which an inverse transistor is to be formed and, at the same time, oxidizing said unmasked second surface portion by said thermal oxidation growth to make a surface oxide film of said second surface portion that is thicker than a surface oxide film of said first surface portion so that said second region is made thinner than said first region.

12. A method of fabricating a semiconductor integrated circuit device according to claim 11, further comprising removing the surface oxide films of uneven thickness after step (f) and forming surface oxide films of equal thickness on both said first and second regions.

13. A method of fabricating a semiconductor integrated circuit device according to claim 11, wherein said depth to which the unmasked portion of said semiconductor layer is etched is less than the total thickness of said semiconductor layer.

14. A method of fabricating a semiconductor integrated circuit device according to claim 11, including, after step (f), forming a normal transistor in said first region and an inverse transistor in said second region.

* * * * *